United States Patent
Mori et al.

(10) Patent No.: US 11,800,615 B2
(45) Date of Patent: Oct. 24, 2023

(54) LIGHT EMITTING MODULE AND METHOD FOR DRIVING LIGHT EMITTING DEVICE

(71) Applicant: NICHIA CORPORATION, Anan (JP)

(72) Inventors: Kana Mori, Anan (JP); Satoshi Yoshinaga, Tokushima (JP)

(73) Assignee: NICHIA CORPORATION, Anan (JP)

( * ) Notice: Subject to any disclaimer, the term of this patent is extended or adjusted under 35 U.S.C. 154(b) by 146 days.

(21) Appl. No.: 17/440,512

(22) PCT Filed: Mar. 18, 2020

(86) PCT No.: PCT/JP2020/012100
§ 371 (c)(1),
(2) Date: Sep. 17, 2021

(87) PCT Pub. No.: WO2020/189735
PCT Pub. Date: Sep. 24, 2020

(65) Prior Publication Data
US 2022/0159803 A1    May 19, 2022

(30) Foreign Application Priority Data
Mar. 18, 2019 (JP) ................... 2019-050027

(51) Int. Cl.
H05B 45/20    (2020.01)
H01L 33/50    (2010.01)
H05B 45/30    (2020.01)

(52) U.S. Cl.
CPC .......... *H05B 45/30* (2020.01); *H01L 33/502* (2013.01)

(58) Field of Classification Search
CPC ........ H05B 45/20; H05B 45/30; H05B 45/59; H01L 33/50; H01L 33/502; H01L 33/504;
(Continued)

(56) References Cited

U.S. PATENT DOCUMENTS 9,967,943 B1 *  5/2018  Wang ................. F21K 9/238
2004/0114396 A1  6/2004  Kobayashi et al.
(Continued)

FOREIGN PATENT DOCUMENTS

JP    2004206044 A      7/2004
JP    2015219277 A  * 12/2015
(Continued)

OTHER PUBLICATIONS

International Search Report in PCT/JP2020/012100, dated Jun. 2, 2020.

*Primary Examiner* — Thai Pham
(74) *Attorney, Agent, or Firm* — Global IP Counselors, LLP

(57) ABSTRACT

A method of driving a light-emitting device includes driving the light-emitting device having a light-emitting element and a light-emitting part that contains two or more types of phosphors adapted to be excited by light emitted from the light-emitting element, the two or more types of phosphors having respectively different afterglow characteristics. The driving of the light-emitting device includes supplying a current to the light-emitting element during a conducting period including a maximum current supply period in which a maximum current in the conducting period is supplied to the light-emitting element, and subsequent to the maximum current supply period, a current reduction period in which the current supplied to the light-emitting element is reduced continuously or stepwise from the maximum current.

10 Claims, 13 Drawing Sheets

(58) Field of Classification Search
CPC ........... H01L 2924/01015; G02F 1/133; G02F 1/1336; G02F 1/133603
See application file for complete search history.

(56) References Cited

U.S. PATENT DOCUMENTS

| | | | | |
|---|---|---|---|---|
| 2006/0208998 | A1* | 9/2006 | Okishiro | G09G 3/3406 345/102 |
| 2017/0213942 | A1* | 7/2017 | Takehara | H01L 33/504 |
| 2018/0063931 | A1* | 3/2018 | Yamamoto | H05B 45/00 |
| 2018/0332677 | A1* | 11/2018 | Ku | H01L 27/156 |

FOREIGN PATENT DOCUMENTS

| | | | | |
|---|---|---|---|---|
| JP | 2015219277 | A | | 12/2015 |
| JP | 2016115497 | A | * | 6/2016 |
| JP | 2016115497 | A | | 6/2016 |
| WO | 2004055577 | A1 | | 7/2004 |
| WO | WO-2004055577 | A1 | * | 7/2004 ........... G09G 3/3406 |

* cited by examiner

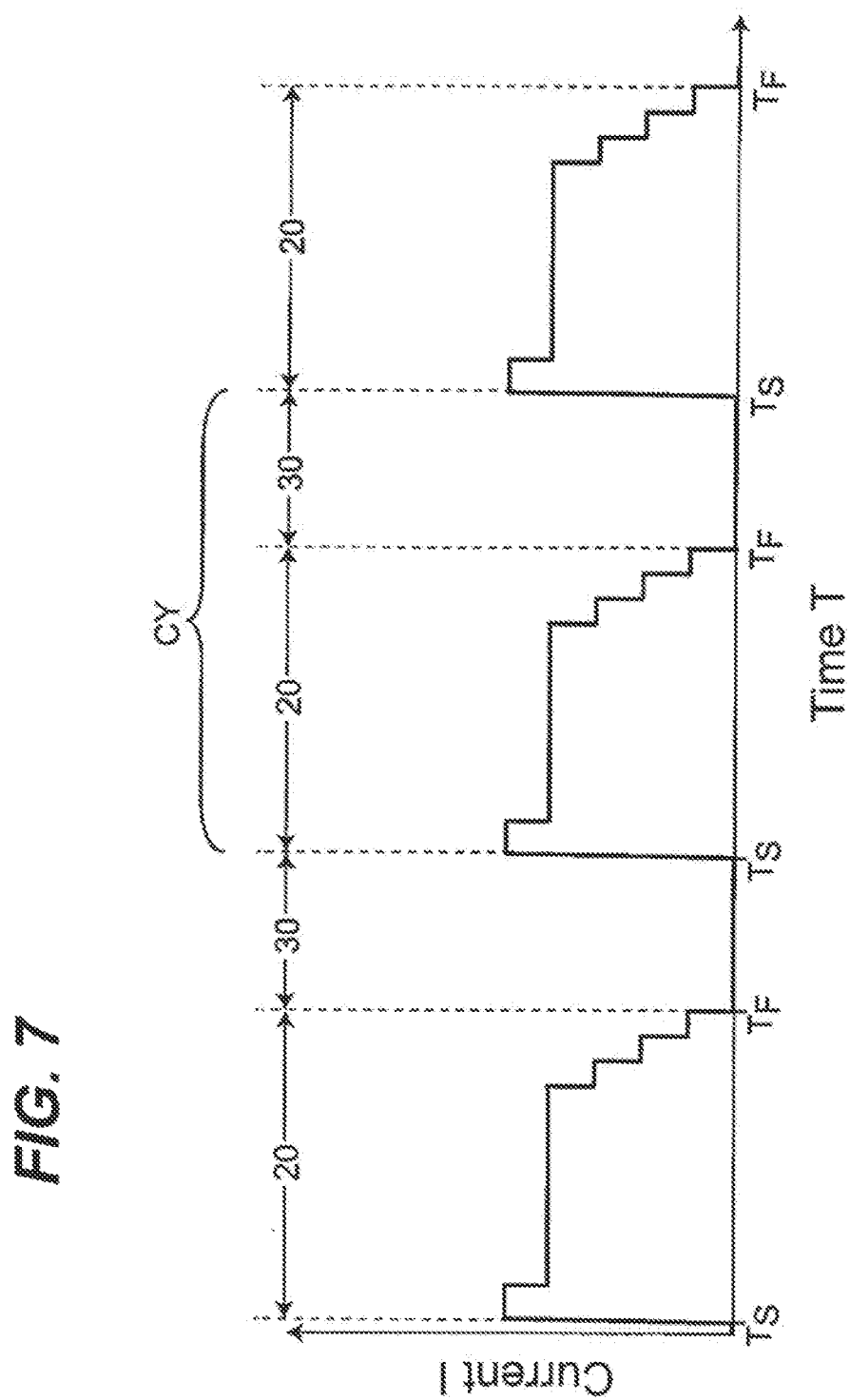

LIGHT EMITTING MODULE AND METHOD FOR DRIVING LIGHT EMITTING DEVICE

CROSS-REFERENCE TO RELATED APPLICATIONS

This is a U.S. national phase application of PCT/JP2020/012100, filed on Mar. 18, 2020, which claims priority to Japanese Patent Application No. 2019-050027, filed on Mar. 18, 2019. The entire disclosure of Japanese Patent Application No. 2019-050027 is hereby incorporated herein by reference.

Technical Field

The present disclosure relates to a light-emitting module and a method of driving a light-emitting device.

Background Art

A light-emitting device including a combination of a light source and a phosphor that absorbs light emitted from the light source and emits light is known, which is used for a backlight for an LCD panel or the like (Japanese Unexamined Patent Application Publication No. 2004-206044 and Japanese Unexamined Patent Application Publication No. 2016-115497).

Japanese Unexamined Patent Application Publication No. 2004-206044 discloses a method of driving a light-emitting device for eliminating the tailing phenomenon of a backlight unit (for example, paragraphs 0164 to 0168 of Japanese Unexamined Patent Application Publication No. 2004-206044). For example, in a backlight unit including a large number of light sources (cold-cathode tubes), immediately after the cold-cathode tubes are driven by a large current, the current is greatly decreased and then smoothly increased in order to eliminate the afterglow of a phosphor. This can eliminate the tailing phenomenon caused by long persistence of a green phosphor in the cold-cathode tubes.

Japanese Unexamined Patent Application Publication No. 2016-115497 discloses a method of driving a light-emitting device containing two types of phosphors having different afterglow characteristics, the method allows for preventing the emission color from being different when the emission intensity is adjusted by pulse width control than that when lighting control is not performed. The light-emitting device includes two light-emitting elements (a first light-emitting element and a second light-emitting element) and two types of phosphors (a first phosphor and a second phosphor) having different afterglow characteristics.

The first light-emitting element and the first phosphor are contained in a first light-emitting part, and the second light-emitting element and the second phosphor are contained in a second light-emitting part. The driving energies of the first light-emitting part and the second light-emitting part can be separately controlled, and the control is performed such that the integrated value of the driving energy of the first light-emitting part is smaller than the integrated value of the driving energy of the second light-emitting part (for example, Claim 1 and paragraphs 0006 to 0011 of Japanese Unexamined Patent Application Publication No. 2016-115497).

SUMMARY

In a light-emitting device containing a light-emitting element and two or more types of phosphors adapted to be excited by the light-emitting element, afterglow of a certain color may be generated due to the difference in afterglow characteristics of the phosphors. There is a demand for a method of driving a light-emitting device that can reduce such afterglow.

Accordingly, an object of the present disclosure is to provide a driving method that allows for reducing afterglow of a certain color attributable to a late afterglow characteristic when a light-emitting device is driven in which the same light-emitting element excites two types of phosphors having different afterglow characteristics.

Another object of the present disclosure is to provide a light-emitting module that can achieve such a driving method.

A driving method according to an embodiment of the present invention includes driving a light-emitting device including a light-emitting element and a light-emitting part that contain two or more types of phosphors with different afterglow characteristics adapted to be excited by the light-emitting element, a conducting period of the light-emitting device including a maximum current supply period in which a maximum current in the conducting period is supplied to the light-emitting element, and, subsequent to the maximum current supply period, a current reduction period in which the current supplied to the light-emitting element is reduced continuously or stepwise from the maximum current.

A light-emitting module according to another embodiment of the present invention includes a light-emitting device including a light-emitting element and a light-emitting part including two or more types of phosphors with different afterglow characteristics adapted to be excited by the light-emitting element and a controller configured to control a current supplied from a power source to the light-emitting element, the controller being configured to control the current to allow a conducting period of the light-emitting device to include a maximum current supply period in which a maximum current in the conducting period is supplied to the light-emitting element, and, subsequent to the maximum current supply period, a current reduction period in which the current supplied to the light-emitting element is reduced continuously or stepwise from the maximum current.

A method of driving according to an embodiment of the present invention allows for reducing afterglow of a certain color.

A light-emitting module of another embodiment of the present invention can achieve the method of driving.

BRIEF DESCRIPTION OF DRAWINGS

FIG. 7 is a time-current graph illustrating a method of driving a light-emitting device according to an embodiment of the present invention.

DESCRIPTION OF EMBODIMENT

Figure 1:
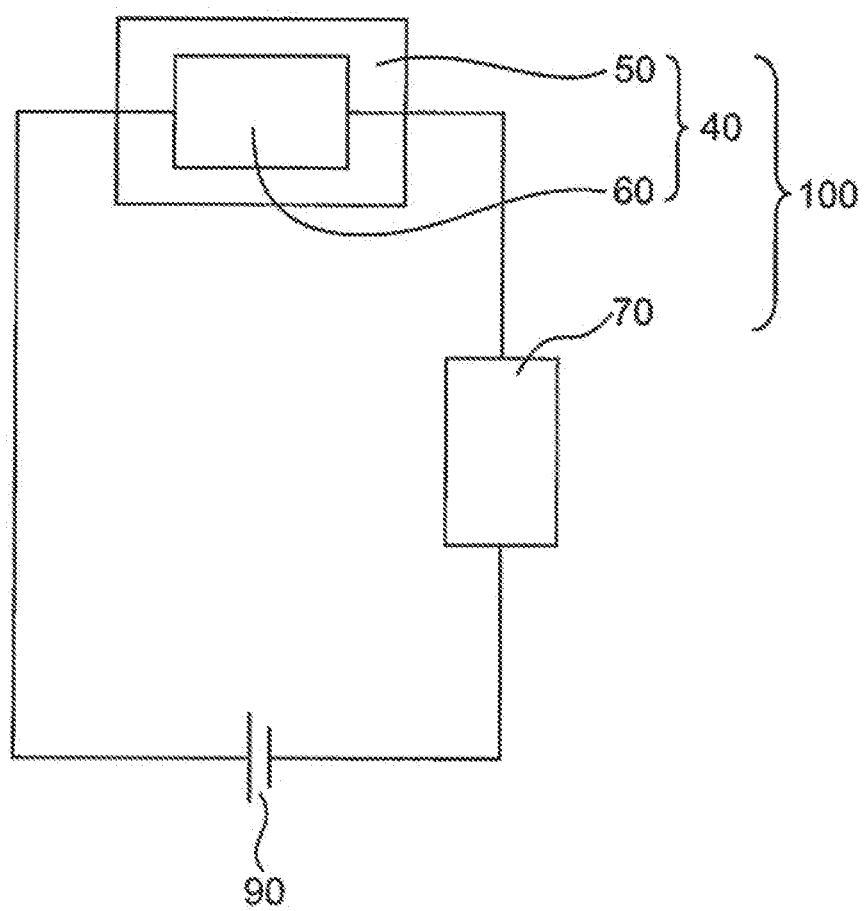
FIG. 1 is a schematic view of a light-emitting module according to an embodiment of the present invention.

Certain embodiments of the present invention will be described below in detail on the basis of the accompanying drawings. The descriptions below include terms indicating specific directions or positions (such as "up", "down", "right", "left", and other terms containing these terms) as appropriate. These terms are used to facilitate understanding of the invention with reference to the drawings, and the meanings of these terms do not limit the technical scope of the present invention. A portion with the same reference numeral in a plurality of drawings represents the same portion or member.

Embodiment

FIG. 1 is a schematic view of a light-emitting module according to an embodiment of the present invention.

As shown in FIG. 1, a light-emitting module 100 includes a light-emitting device 40 and a controller 70. The light-emitting device 40 includes a light-emitting part 50 and a light-emitting element 60. The light-emitting device 40 is connected to a power source 90 that supplies a current to the light-emitting element 60, and a current supplied to the light-emitting element 60 is controlled by the controller 70.

Figure 2A:
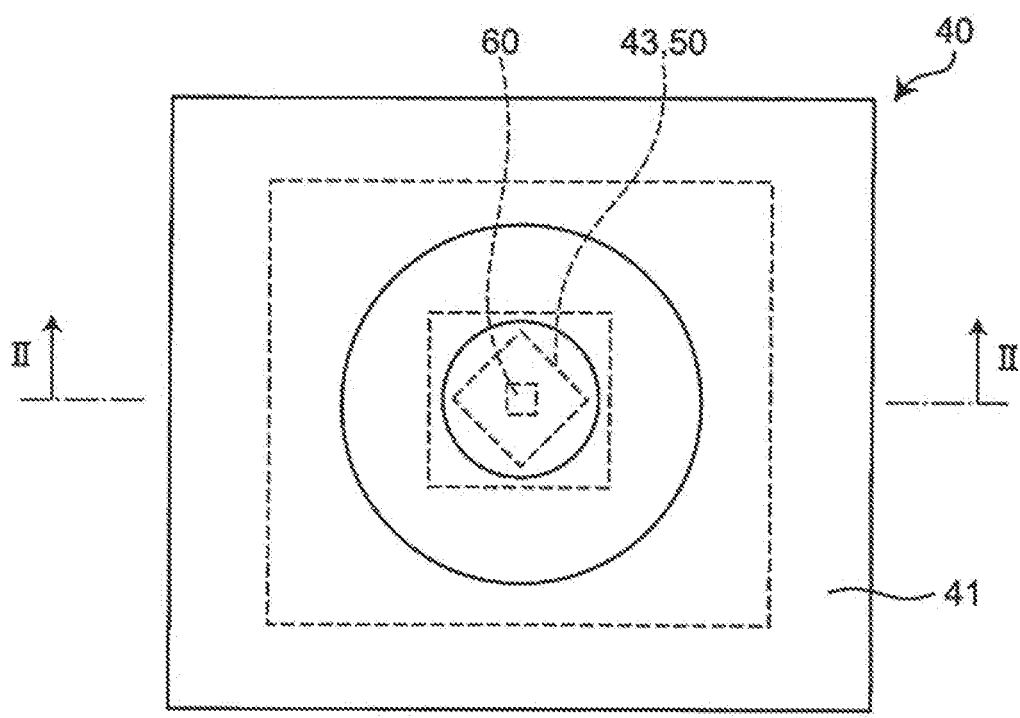
FIG. 2A is a schematic top view of a mode of a light-emitting device.
Figure 2B:
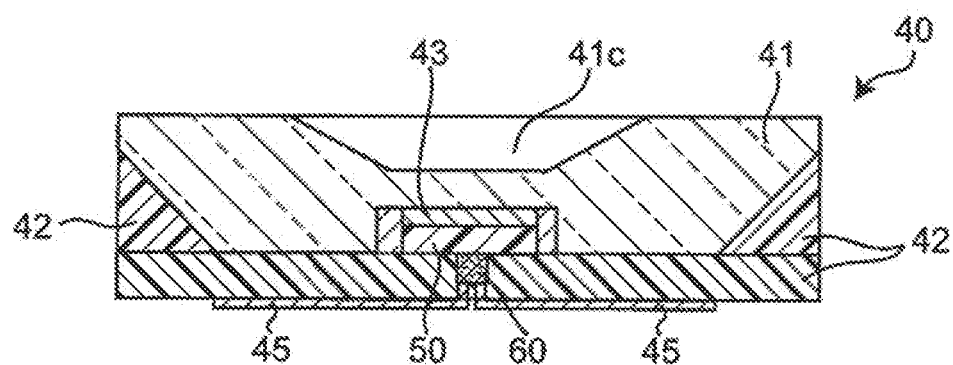
FIG. 2B is a schematic cross-sectional view taken along line II-II of FIG. 2A.
Figure 2C:
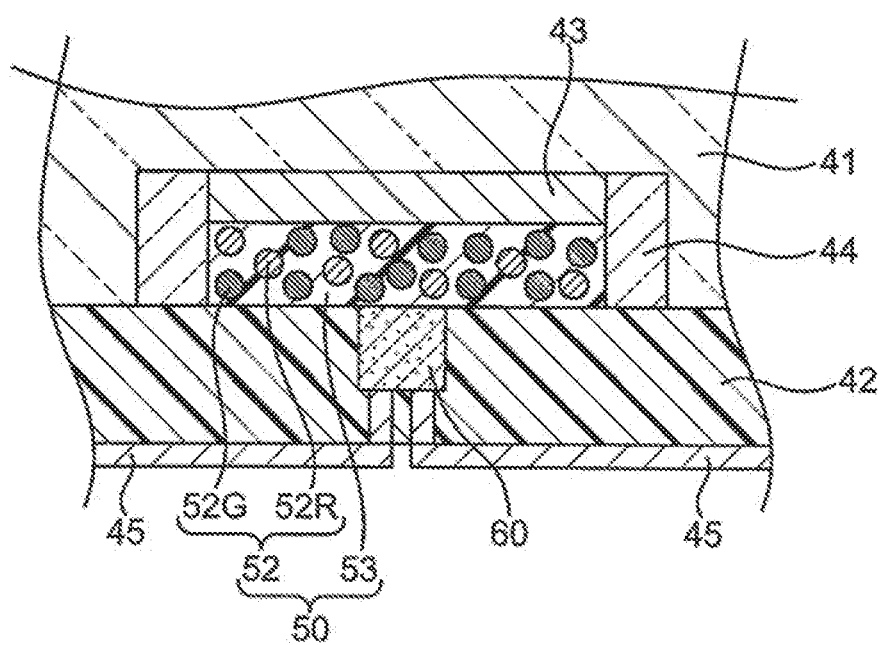
FIG. 2C is a partial enlarged cross-sectional view showing a portion of FIG. 2B.

FIG. 2A, FIG. 2B, and FIG. 2C schematically illustrate a mode of the light-emitting device 40. The light-emitting part 50 contains phosphors 52 that are excited by absorption of light (such as blue light) emitted from the light-emitting element 60. The phosphors 52 contain two or more types of phosphors (such as a green phosphor 52G and a red phosphor 52R). The light-emitting part 50 may further contain light-transmissive resin 53 that fixes the phosphors 52 in a dispersed state.

A portion of light emitted from the light-emitting element 60 is absorbed by the phosphors 52, and the remaining portion of the light passes through the light-emitting part 50 and serves as transmitted light. The transmitted light is mixed with the fluorescence from the phosphors 52, so that the light-emitting device 40 can emit light having a desired emission color. For example, a mixture of blue transmitted light, green light emitted from the green phosphor 52G, and red light emitted from the red phosphor 52R allows the light-emitting device 40 to emit white light.

The two or more types of phosphors 52G and 52R differ from each other in afterglow characteristics. The term "afterglow characteristic" as used in the present specification refers to the delay time elapsed from interruption of light entering a phosphor to cease of the fluorescence from the phosphor. In the present specification, the time elapsed from incidence of light on the phosphors 52 to emission of fluorescence from the phosphors is referred to as a "response to light".

Figure 3:
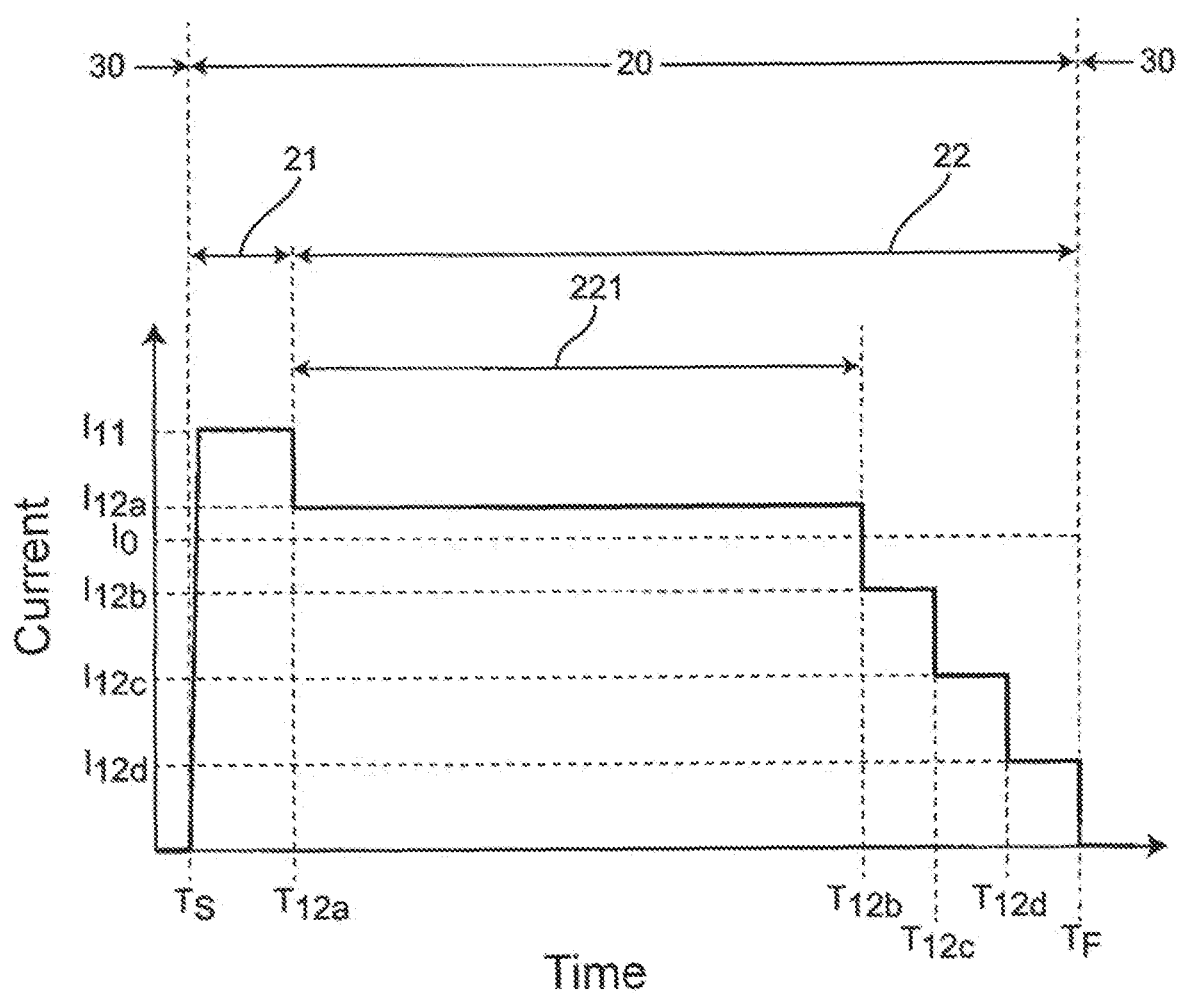
FIG. 3 is a time-current graph illustrating a method of driving a light-emitting device according to an embodiment of the present invention.
Figure 4A:
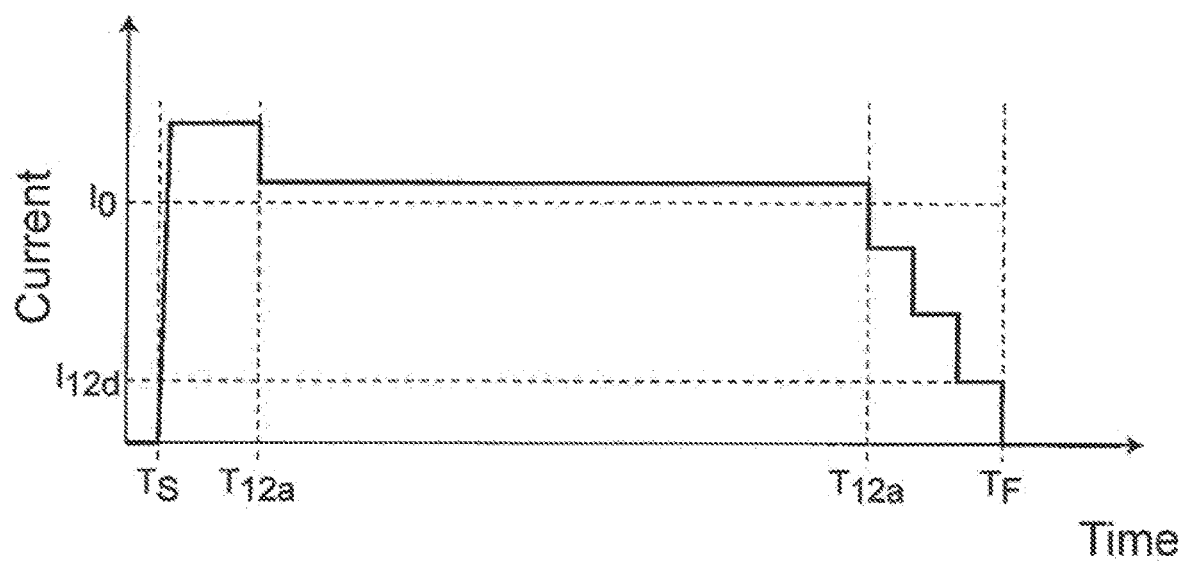
FIG. 4A is a graph showing a current value when a current is applied to the light-emitting device by a conduction method according to an embodiment of the present invention.
Figure 4B:
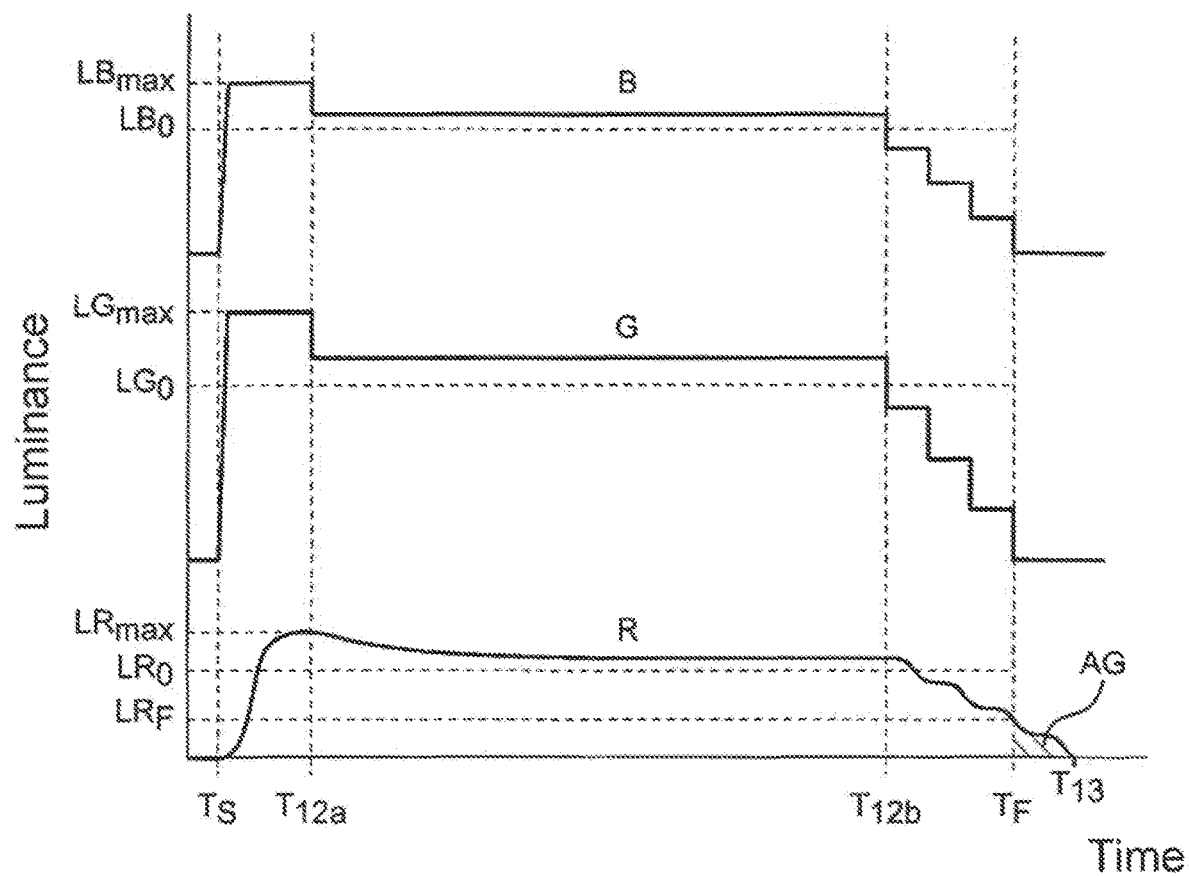
FIG. 4B is a graph showing the relation between an emission luminance (B) of a light-emitting element and fluorescence intensities (G and R) of phosphors when a current is applied by the conduction method shown in FIG. 4A.

In the light-emitting device 40 including the light-emitting part 50 containing the phosphors 52 with different afterglow characteristics, afterglow may cause a problem. In order to reduce afterglow, a method of driving the light-emitting device 40 as illustrated in FIG. 3, FIG. 4A, and FIG. 4B is employed in an embodiment of the present invention. The driving method of the present embodiment will be described in detail referring to FIG. 3, FIG. 4A, FIG. 4B, FIG. 5A, and FIG. 5B.

(1. Method of Driving Light-Emitting Device 40)

Figure 5A:
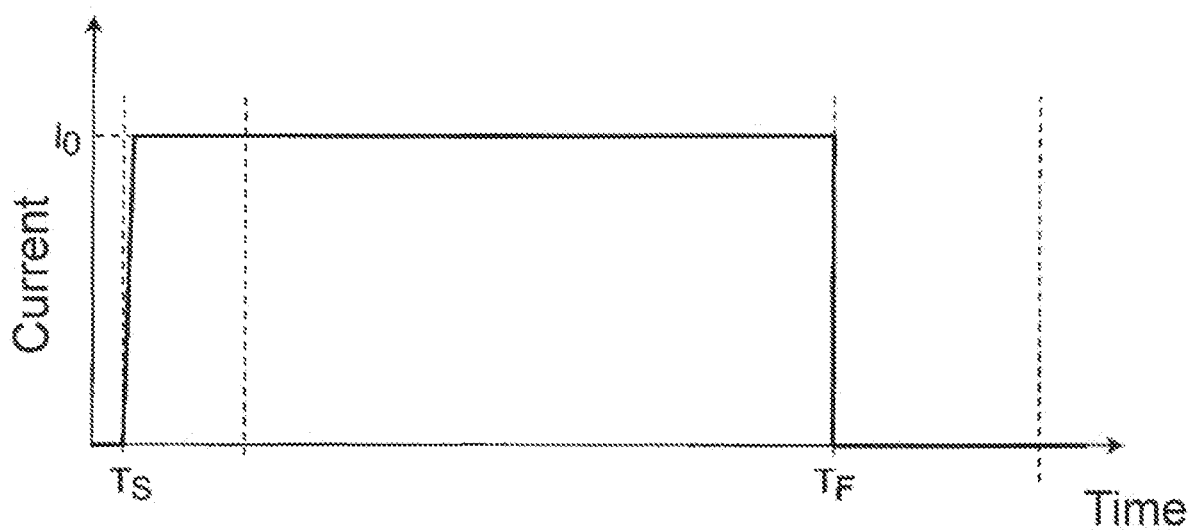
FIG. 5A is a graph showing a current value when a current is applied to the light-emitting device in a conventional conduction method.
Figure 5B:
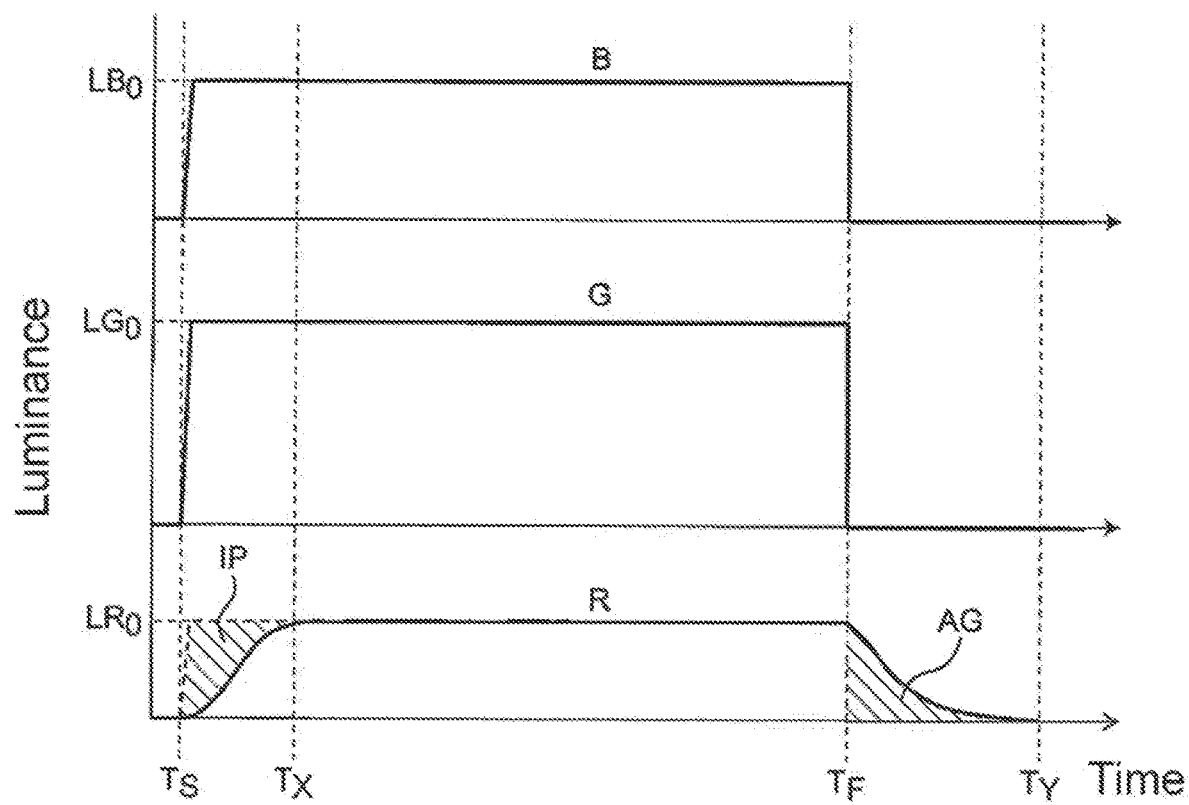
FIG. 5B is a graph showing the relationship between an emission luminance (B) of the light-emitting element and fluorescence intensities (G and R) of the phosphors when a current is applied in the conduction method shown in FIG. 5A.

FIG. 5A and FIG. 5B show the case in which the light-emitting device 40 is caused to emit light using a conventional driving method.

Supposing a current required for allowing the light-emitting device 40 to emit light with a desired emission luminance is a standard current $I_0$, the standard current $I_0$ is applied at a conduction start time $T_S$, and the supply of the current is completely stopped at a conduction end time $T_F$ in the conventional driving method.

As shown in the graph B of FIG. 5B, when the standard current $I_0$ is applied at the conduction start time $T_S$, the blue transmitted light from the blue light-emitting element 60 immediately reaches a desired emission luminance $LB_0$. When the supply of the current is stopped at the conduction end time $T_F$, the luminance of the blue transmitted light immediately drops to zero.

The green phosphor 52G absorbs blue light emitted from the blue light-emitting element 60 and emits light. For example, the green phosphor 52G emits green light immediately after absorbing blue light, and the green light is quenched immediately after irradiation of the blue light is stopped. That is, the case in which a phosphor with a quick response and a short afterglow characteristic is used for the green phosphor 52G will be postulated.

As shown in the graph G of FIG. 5B, when the standard current $I_0$ is applied at the conduction start time $T_S$, green light from the green phosphor 52G immediately reaches a desired emission luminance $LG_0$. When the supply of the current is stopped at the conduction end time $T_F$, the luminance of the green light immediately drops to zero.

On the other hand, the red phosphor 52R absorbs blue light emitted from the blue light-emitting element 60 and emits light. For example, the red phosphor 52R absorbs blue light and then emits red light after a delay of some milliseconds, and there is a delay of some milliseconds before the red light is quenched after irradiation of the blue light is stopped. That is, the case in which a phosphor with a slow response and a long afterglow characteristic is used for the red phosphor 52R will be postulated.

As shown in the graph R of FIG. 5B, when the standard current $I_0$ is applied at the conduction start time $T_S$, red light from the red phosphor 52R reaches a desired emission luminance $LR_0$ at a point in time $T_X$. After the supply of the current is stopped at the conduction end time $T_F$, the luminance of the red light drops to zero at a point in time $T_Y$.

If the light-emitting device 40 including the green phosphor 52G with a quick response and the red phosphor 52R with a slow response as described above is driven in the conventional driving method, the emission color of the light-emitting device 40 is deficient in the red component (region IP) in the period from the conduction start time $T_S$ to the point in time $T_X$.

In the case of the light-emitting device 40 including the green phosphor 52G with a short afterglow characteristic and the red phosphor 52R with a long afterglow characteristic, red afterglow (region AG) from the light-emitting device 40 is visually recognizable in the period from the conduction end time $T_F$ to the point in time $T_Y$. That is, in the conventional method of driving the light-emitting device 40, afterglow is produced after a conducting period 20 (from the conduction start time $T_S$ to the conduction end time $T_F$).

As a result of various examinations of the afterglow, the present inventors have found that the afterglow after the conducting period 20 mainly depends on the emission luminance of the red light at a current $I_{12d}$ immediately before the conduction end time $T_F$. Accordingly, in the method of driving the light-emitting device 40 according to an embodiment of the present invention, a maximum current supply period 21 is set in the first half of the conducting period 20, and the current value is reduced over time in a subsequent current reduction period 22 as shown in FIG. 3.

The initial portion (from the conduction start time $T_S$ to a point in time $T_{12a}$ in FIG. 3) of the conducting period 20 is the maximum current supply period 21 in which a maximum current $I_{11}$ in the conducting period 20 is supplied to the light-emitting element 60. After the maximum current supply period 21, the current reduction period 22 is set in which the current supplied to the light-emitting element 60 is reduced continuously or stepwise from the maximum current $I_{11}$. In general, the current reduction period 22 is the period from the end (point in time $T_{12a}$) of the maximum current supply period 21 to the conduction end time $T_F$.

FIG. 3 shows an example in which the current is reduced stepwise (that is, the current is kept constant and then drops sharply) in the current reduction period 22, but the current may be reduced continuously (that is, the current may be gradually reduced without abrupt changes).

In the current reduction period 22 in FIG. 3, the current drops three times (at points in time $T_{12b}$, $T_{12c}$, and $T_{12d}$) in the period from the point in time $T_{12a}$ to the conduction end time $T_F$. The current drops from a current $I_{12a}$ to a current $I_{12b}$ at the point in time $T_{12b}$, the current drops from the current $I_{12b}$ to a current $I_{12c}$ at the point in time $T_{12c}$, and the current drops from the current $I_{12c}$ to a current $I_{12d}$ at the point in time $T_{12d}$. The current drops from the current $I_{12d}$ to zero at the conduction end time $T_F$.

If a current is applied to the light-emitting element 60 of the light-emitting device 40 along the time-current graph as shown in FIG. 3 and FIG. 4A, the luminance of the blue transmitted light from the blue light-emitting element 60, the luminance of green light from the green phosphor 52G, and the luminance of red light from the red phosphor 52R are respectively represented by the graph B, the graph G, and the graph R of FIG. 4B.

It is preferable that the maximum current $I_{11}$ be larger than the standard current $I_0$ and that the currents $I_{12b}$, $I_{12c}$, and $I_{12d}$ be smaller than the standard current $I_0$ as shown in FIG. 3. The current $I_{12a}$ is larger than the standard current $I_0$ in FIG. 3, but the current $I_{12a}$ may be equal to or smaller than the standard current $I_0$ considering the luminance of the light-emitting device 40.

As shown in the graph B of FIG. 4B, when the maximum current $I_{11}$ is applied at the conduction start time $T_S$, the blue transmitted light from the blue light-emitting element 60 immediately reaches a maximum luminance $LB_{MAX}$. The maximum luminance $LB_{MAX}$ is higher than the demanded emission luminance $LB_0$ of the blue transmitted light of the light-emitting device 40. The current then drops stepwise, and the luminance of the blue transmitted light also drops stepwise with substantially the same timings. When the supply of the current is stopped at the conduction end time $T_F$, the luminance of the blue transmitted light immediately drops to zero.

As shown in the graph G of FIG. 4B, when the maximum current $I_{11}$ is applied at the conduction start time $T_S$, green light from the green phosphor 52G immediately reaches a maximum luminance $LG_{MAX}$. The maximum luminance $LG_{MAX}$ is higher than the demanded emission luminance $LG_0$ of the green light of the light-emitting device 40. The current then drops stepwise, and the luminance of the green light also drops stepwise with substantially the same timings. When the supply of the current is stopped at the conduction end time $T_F$, the luminance of the green light immediately drops to zero.

As shown in the graph R of FIG. 4B, when the maximum current $I_{11}$ is applied at the conduction start time $T_S$, red light from the red phosphor 52R reaches a maximum luminance $LR_{MAX}$ at the point in time $T_{12a}$. It is thought that setting the maximum current $I_{11}$ to be larger than the standard current $I_0$ allows for facilitating excitation of the red phosphor 52R. This may allow the period of time (period from the conduction start time $T_S$ to the point in time $T_{12a}$) until the luminance reaches the maximum luminance $LR_{MAX}$ to be shorter than the period of time (period from the conduction start time $T_S$ to the point in time $T_X$ in FIG. 5B) until the luminance reaches the emission luminance $LR_0$ in the case in which the standard current $I_0$ is applied.

The current then drops stepwise, and the luminance of the red light also drops stepwise behind the timings of the drops of the current. After the supply of the current is stopped at the conduction end time $T_F$, the luminance of the red light drops to zero at a point in time $T_{13}$. The current $I_{12d}$ immediately before the conduction end time $T_F$ is smaller than the standard current $I_0$ as shown in FIG. 4A, so that an emission luminance $LR_F$ of red light at the conduction end time $T_F$ is smaller than the emission luminance $LR_0$. That is, the luminance of the red color drops stepwise and approaches zero toward the conduction end time $T_F$. Accordingly, the period of time (from the conduction end time $T_F$ to the point in time $T_{13}$ when the afterglow AG ceases) until the luminance of the light-emitting device 40 drops from the emission luminance $LR_F$ to zero is shorter than the period of time (from the conduction end time $T_F$ to the point in time $T_Y$ when the afterglow AG is extinguished in FIG. 5B) until the luminance drops from the emission luminance $LR_0$ to zero.

The expression that the luminance of the light-emitting device 40, the phosphors 52, or the like is "zero" as used in the present specification indicates that light from the light-emitting device 40, the phosphors 52, or the like is not substantially visually recognizable.

When the current is controlled such that the conducting period 20 includes the maximum current supply period 21 at first and the subsequent current reduction period 22 (FIG. 3), the emission luminance $LR_F$ of red emission produced by the current $I_{12d}$ immediately before the conduction end time $T_F$ can be reduced. Accordingly, the intensity of the afterglow AG produced after the conducting period 20 (after the conduction end time $T_F$) can be reduced, and the period of time (period from the conduction end time $T_F$ to the point in time $T_{13}$) until the afterglow AG is quenched can also be reduced.

FIG. 4B shows the combination of the green phosphor 52G with a short afterglow characteristic and the red phosphor 52R with a long afterglow characteristic as an example of the two or more types of phosphors 52 with different afterglow characteristics. Other combination than above may be alternatively employed, and a green phosphor 52G with a long afterglow characteristic and a red phosphor 52R with a short afterglow characteristic can be combined.

In addition to the green phosphor 52G and the red phosphor 52R, another phosphor (such as a yellow phosphor) may be contained. The green phosphor 52G and the red phosphor 52R may have substantially the same afterglow characteristic (the same degree of afterglow characteristic), and the other phosphor may have a different afterglow characteristic (such as an afterglow characteristic longer than the afterglow characteristics of the other phosphors).

Afterglow of the light-emitting device 40 including any combination of phosphors can be reduced by using the driving method including the current control as shown in FIG. 3.

As described above, the afterglow is produced by fluorescence of the phosphor (red phosphor 52R in the example shown in FIG. 3) with the longest afterglow characteristic. Accordingly, when the current supplied to the light-emitting element 60 is controlled, the control is preferably performed according to the afterglow characteristic of the phosphor (red phosphor 52R) with the slowest response to light out of the two or more phosphors 52.

Figure 6:
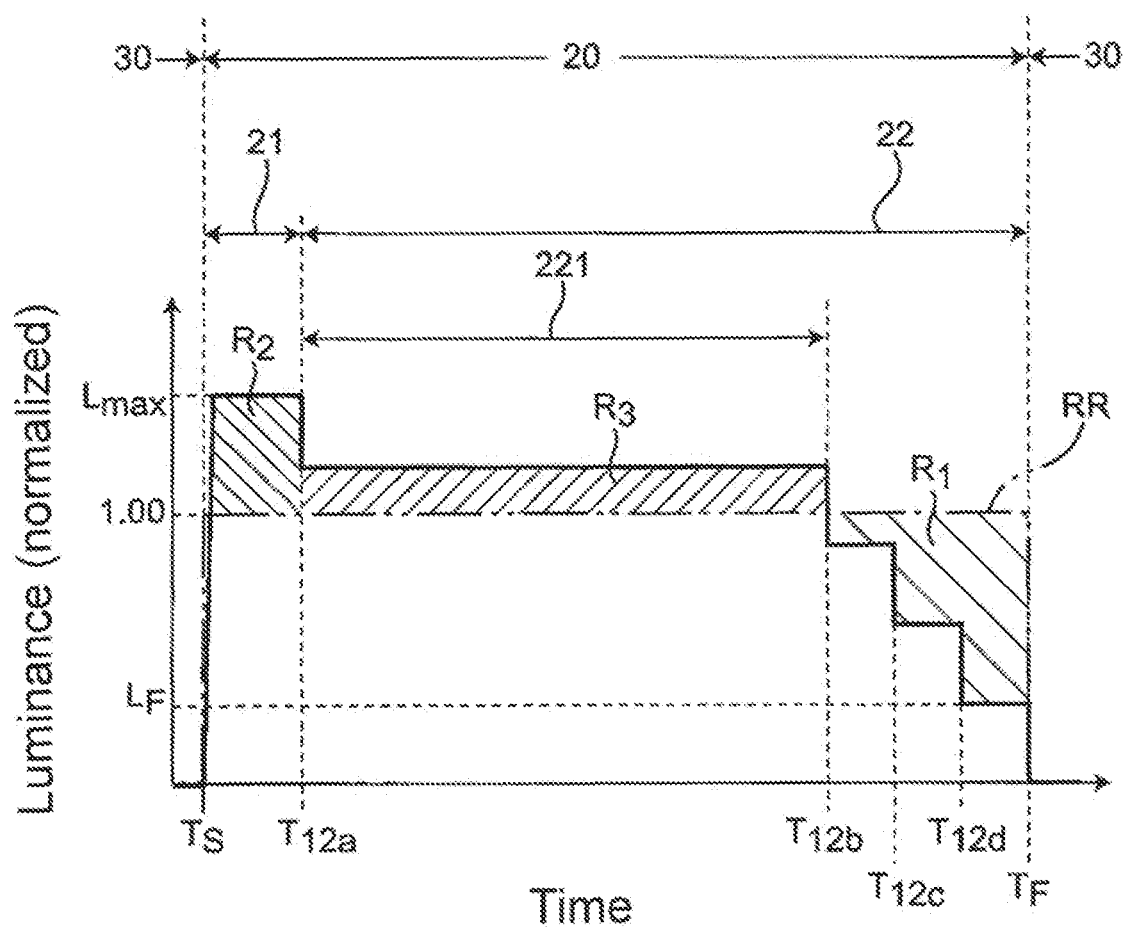
FIG. 6 is a time-luminance graph of the light-emitting device when a current is applied to the light-emitting device on the basis of the time-current graph of FIG. 3.

FIG. 6 is a time-luminance graph of the light-emitting device 40 when a current is applied to the light-emitting element 60 of the light-emitting device 40 on the basis of the time-current graph of FIG. 3. Values on the vertical axis are normalized such that the luminance when the standard current $I_0$ is applied becomes 1.00.

The emission luminance $L_F$ of the light-emitting device 40 at the end (that is, the conduction end time $T_F$) of the current reduction period 22 is preferably 50% or less of the maximum luminance $L_{MAX}$ of the light-emitting device 40. This allows for effectively reducing the period from the conduction end time $T_F$ to the point in time $T_{13}$ when the afterglow AG is extinguished (FIG. 4B).

Controlling (reducing) the current by using the method of driving the light-emitting device 40 allows the emission luminance $L_F$ of the light-emitting device 40 at the conduction end time $T_F$ to be 50% or less of the maximum luminance $L_{MAX}$.

In the method of driving the light-emitting device 40, as shown in FIG. 7, an idle period 30 in which the current is not supplied to the light-emitting element 60 may be set after the conducting period 20. A conducting period 20 may be set after the idle period 30, and an idle period 30 may be further set after the conducting period 20. In this case, the sum of the conducting period 20 and the subsequent idle period 30 is referred to as a single cycle CY.

The period of time from the beginning (corresponding to the conduction end time $T_F$) of the idle period 30 to the point in time (point in time $T_{13}$ in FIG. 4B) when the luminance of the light-emitting device 40 reaches zero is preferably 20% or less of the length (duration) of the cycle CY (total of the conducting period 20 and the idle period 30). That is, the period of time in which the afterglow AG lasts is preferably 20% or less of the length of the cycle CY.

Accordingly, in the method of driving the light-emitting device 40, the current is preferably controlled such that the period of time of the afterglow AG is 20% or less of the length of the cycle CY.

Reference is made to FIG. 3 and FIG. 6 again. In the current reduction period 22, the current supplied to the light-emitting element 60 may be kept at a constant value (current $I_{12a}$) smaller than the maximum current $I_{11}$ in the period (such as the period from the point in time $T_{12a}$ to the point in time $T_{12b}$) from the beginning (corresponding to the point in time $T_{12a}$) of the current reduction period 22 to a predetermined point in time. The period in which the current is kept at the current $I_{12a}$ will be referred to as a "current retention period 221". That is, the current reduction period 22 may include the current retention period 221.

The current $I_{12a}$ (constant value) in the current retention period 221 and the length of the current retention period 221 (from the point in time $T_{12a}$ to the point in time $T_{12b}$) are desirably controlled on the basis of the time-integrated luminance of the light-emitting device 40 over the conducting period 20.

The expression "time-integrated luminance of the light-emitting device 40 over the conducting period 20" (hereinafter referred to as an "integrated luminance") as used herein refers to the area of a region between the graph showing the luminance and the horizontal axis (time axis) in the time-luminance graph as shown in FIG. 6. The area can be deemed to be the total luminance of light obtained from the light-emitting device 40 over the conducting period 20. In the case in which the conducting period 20 and the idle period 30 are repeated as shown in FIG. 7, the integrated luminance over the cycle CY serves as an indicator of the degree of brightness of the light-emitting device 40.

The integrated luminance in the case in which the standard current $I_0$ is continuously applied from the beginning (conduction start time $T_S$) to the end (conduction end time $T_F$) of the conducting period 20 is referred to as a reference integrated luminance.

FIG. 6 shows the emission luminance of the light-emitting device 40 in the case in which a current is applied as shown in the graph of FIG. 3. The vertical axis (luminance) of FIG. 6 is normalized such that the emission luminance (referred to as a "reference luminance") when the standard current $I_0$ is applied to the light-emitting device 40 becomes 1.00.

In FIG. 6, the reference integrated luminance can be deemed to be the area of a rectangular region RR (region defined by dash-dot-dot lines) with a width that is the "length from the conduction start time $T_S$ to the conduction end time $T_F$" and a height that is the "intensity of the reference luminance".

In an embodiment of the present invention, a current is smaller than the standard current $I_0$ in at least a portion of the current reduction period 22 as shown in FIG. 3. For example, the currents $I_{12b}$, $I_{12c}$, and $I_{12d}$ are smaller than the standard current $I_0$ in the period from the point in time $T_{12b}$ to the point in time $T_F$ in the graph of FIG. 3. Accordingly, as shown in FIG. 6, the emission luminance of the light-emitting device 40 is smaller than the reference luminance (1.00) in the period from the point in time $T_{12b}$ to the conduction end time $T_F$. Thus, the integrated luminance over the period from the point in time $T_{12b}$ to the conduction end time $T_F$ is smaller than the region RR, indicating the reference integrated luminance, in that period by the area of a region R1. That is, the luminance of the light-emitting device 40 is reduced.

The integrated luminance over the cycle CY is preferably caused to be substantially equal to the reference integrated luminance by offsetting the lack (area of the region R1) of the integrated luminance by an increase in the integrated luminance in the period from the conduction start time $T_S$ to the point in time $T_{12b}$.

In the period (maximum current supply period 21) from the conduction start time $T_S$ to the point in time $T_{12a}$, the maximum current $I_{11}$ larger than the standard current $I_0$ is applied (FIG. 3). Accordingly, the integrated luminance over the maximum current supply period 21 is larger than the region RR, indicating the reference integrated luminance, in the maximum current supply period 21 by the area of a region R2 as shown in FIG. 6.

Further, in the case in which the current $I_{12a}$ in the period from the point in time $T_{12a}$ to the point in time $T_{12b}$ is larger than the standard current $I_0$ as shown in FIG. 3, the integrated luminance over the period from the point in time $T_{12a}$ to the point in time $T_{12b}$ is larger than the region RR, indicating the reference integrated luminance, in that period by the area of the region R3 as shown in FIG. 6.

As shown in FIG. 6, the duration of the maximum current supply period 21, the maximum current $I_{11}$, the length of the period from the point in time $T_{12a}$ to the point in time $T_{12b}$, and the current $I_{12a}$ are preferably adjusted such that the relationship (the area of the region R1)=(the area of the region R2)+(the area of the region R3) is satisfied. This allows the actual integrated luminance over the cycle CY to be substantially equal to the reference integrated luminance, so that the brightness of the light-emitting device 40 can be secured even with the current reduction period 22.

The area of the region R2 can be increased by increasing the duration of the maximum current supply period 21 and/or increasing the maximum current $I_{11}$. In this case, the area of the region R2 can be equal to or larger than the area of the region R1.

In the case in which the area of the region R2 is substantially equal to the area of the region R1, the area of the region R3 may be zero. That is, the current $I_{12a}$ in the period from the point in time $T_{12a}$ to the point in time $T_{12b}$ may be approximately equal to the standard current $I_0$.

As described above, when the period from the point in time $T_{12a}$ to the point in time $T_{12b}$ in the conducting period 20 are defined as the current retention period 221 and the duration of the current retention period 221 and the current $I_{12a}$ in the current retention period 221 are determined, it is preferable to consider that the integrated luminance of the light-emitting device 40 over the conducting period 20 is substantially equal to the reference integrated luminance. This allows the light-emitting device 40 to emit light with substantially the same brightness as the brightness of the light-emitting device 40 supplied with the standard current $I_0$.

The maximum current $I_{11}$ is preferably controlled on the basis of the time-integrated luminance (integrated luminance) of the light-emitting device 40 over the conducting period 20 as described above.

For the phosphors 52, various fluorescent materials can be used. Examples thereof include a β-SiAlON phosphor serving as the green phosphor 52G, a $Mn^{4+}$-activated fluoride phosphor (KSF phosphor) serving as the red phosphor 52R, and a YAG phosphor that is a yellow phosphor. The driving method according to an embodiment of the present invention is particularly effective for the light-emitting device 40 containing a phosphor that is likely to produce afterglow, so that the driving method can be particularly effective for the light-emitting device 40 containing a KSF phosphor having a comparatively late afterglow characteristic.

(2. Light-Emitting Device 40 Controlled by Driving Method)

The light-emitting device 40 suitable for performing the driving method described above will be described.

As shown in FIG. 1, FIG. 2A, and FIG. 2B, the light-emitting device 40 includes the light-emitting element 60 and the two or more types of phosphors 52 (52G and 52R) with different afterglow characteristics, the two or more types of phosphors 52 adapted to be excited by the light-emitting element 60. The current supplied from the power source 90 to the light-emitting element 60 is controlled by the controller 70.

Constituent members such as the light-emitting device 40 and the controller 70 are described referring to FIG. 2A and FIG. 2B.

(i) Controller 70

The controller 70 is configured to control the current as shown in FIG. 3. A component that can achieve the current control as performed in the method of driving the light-emitting device 40 as described above is used for the controller 70. In particular, the controller 70 configured to perform the control that will be described below is used.

The controller 70 is configured to control the current such that the conducting period 20 includes the maximum current supply period 21 in which the maximum current $I_{11}$ in the conducting period 20 is supplied to the light-emitting element 60 and the current reduction period 22 in which the current is reduced continuously or stepwise from the maximum current $I_{11}$ subsequent to the maximum current supply period 21 (FIG. 3).

It is preferable that the controller 70 is configured to control the current such that the emission luminance $L_F$ of the light-emitting device 40 at the end (conduction end time $T_F$) of the current reduction period 22 is 50% or less of the maximum luminance $L_{MAX}$ of the light-emitting device 40 (FIG. 6).

It is preferable that the controller 70 is configured to control the current such that the idle period 30 in which the current is not supplied to the light-emitting element 60 is further included after the conducting period 20 (FIG. 7) and such that the period of time from the beginning (conduction end time $T_F$) of the idle period 30 to the point in time (point in time $T_{13}$ in FIG. 4B) when the luminance of the light-emitting device 40 reaches zero is 20% or less of the length of the single cycle CY (total of the conducting period 20 and the idle period 30).

It is preferable that the controller 70 perform control such that, in the current reduction period 22, the current supplied to the light-emitting element 60 is kept at a constant value (current $I_{12a}$) smaller than the maximum current $I_{11}$ over a predetermined period of time (such as the period from the point in time $T_{12a}$ to the point in time $T_{12b}$: the current retention period 221) from the beginning (corresponding to the point in time $T_{12a}$) of the current reduction period 22 (FIG. 3).

It is desirable that the controller 70 is configured to control the current $I_{12a}$ in the current retention period 221 and the length of the current retention period 221 (from the point in time $T_{12a}$ to the point in time $T_{12b}$) on the basis of the time-integrated luminance of the light-emitting device 40 over the conducting period 20 (FIG. 6).

It is preferable that the controller 70 is configured to control the maximum current $I_{11}$ on the basis of the time-integrated luminance (integrated luminance) of the light-emitting device 40 over the conducting period 20 (FIG. 6).

(ii) Light-Emitting Element 60

For the light-emitting element 60, a known semiconductor light-emitting element can be used. In the present embodiment, a light-emitting diode including a semiconductor layered body will be described as an example of the light-emitting element 60. For example, the light-emitting element 60 is configured to emit blue light. An element that is configured to light with an appropriate wavelength can be selected as the light-emitting element 60. Examples of an element configured to emit blue or green light include a light-emitting element using a nitride semiconductor ($In_xAl_yGa_{1-x-y}N$, where $0 \leq X$, $0 \leq Y$, and $X+Y \leq 1$) or GaP. Alternatively, a semiconductor light-emitting element made of a material other than the above materials can be used. Various emission wavelengths can be selected by changing the materials for the semiconductor layer and the mixing ratio.

(iii) Light-Emitting Part 50 (Phosphors 52 and Resin 53)

The light-emitting part 50 contains two or more types of phosphors 52. The light-emitting part 50 may contain the light-transmissive resin that fixes the phosphors 52 in a dispersed state.

Examples of materials preferable for the phosphors 52 include a β-SiAlON phosphor that is a green phosphor, a $Mn^{4+}$-activated fluoride phosphor (KSF phosphor) that is a red phosphor, and a YAG phosphor that is a yellow phosphor. Two or more types of phosphors (such as a β-SiAlON phosphor and a KSF phosphor) among these phosphors may be used for the light-emitting part 50.

(iv) Light-Guiding Plate 41

The light-emitting device 40 may include a light-guiding plate 41 that propagates light emitted from the light-emitting element 60. A portion (lower surface of the light-guiding plate 41 in FIG. 2B) of the light-guiding plate 41 can have a recess with a rectangular cross-sectional shape, and the light-emitting part 50 may be fixed inside the recess. A recess 41c with the shape of a downward conical frustum (truncated cone) may be formed in the upper surface (light extraction surface) of the light-guiding plate 41. The recess 41c allows for enhancing the light extraction efficiency of the light-guiding plate 41. Light-transmissive resin containing a diffusing material may be injected into the recess 41c.

(v) White Resin 42

The light-emitting device 40 may contain light-reflective white resin 42. The white resin 42 covers the lower surface of the light-guiding plate 41 and can reflect light toward the upper surface (light extraction surface) of the light-guiding plate. The white resin preferably has an inclined wall in the lateral surface direction of the light-emitting part 50 and can reflect, toward the upper surface (light extraction surface), light traveling laterally from the light-emitting part 50.

(vi) Light-Diffusing Unit 43, Transparent Resin 44, and Wiring Layer 45

The light-emitting device 40 may include a light-diffusing unit 43 covering the upper surface of the light-emitting part 50. With this structure, light of high intensity passing through the upper surface of the light-emitting part 50 can be shielded, so that light emitted from the light-emitting device 40 can be uniform.

The light-emitting device 40 may include transparent resin 44 that fixes the light-emitting element 60 to the recess at the lower surface side of the light-guiding plate 41.

The light-emitting device 40 can include a wiring layer 45 that connects the light-emitting element 60 to the power source 90.

(First Modification)

Figure 8A:
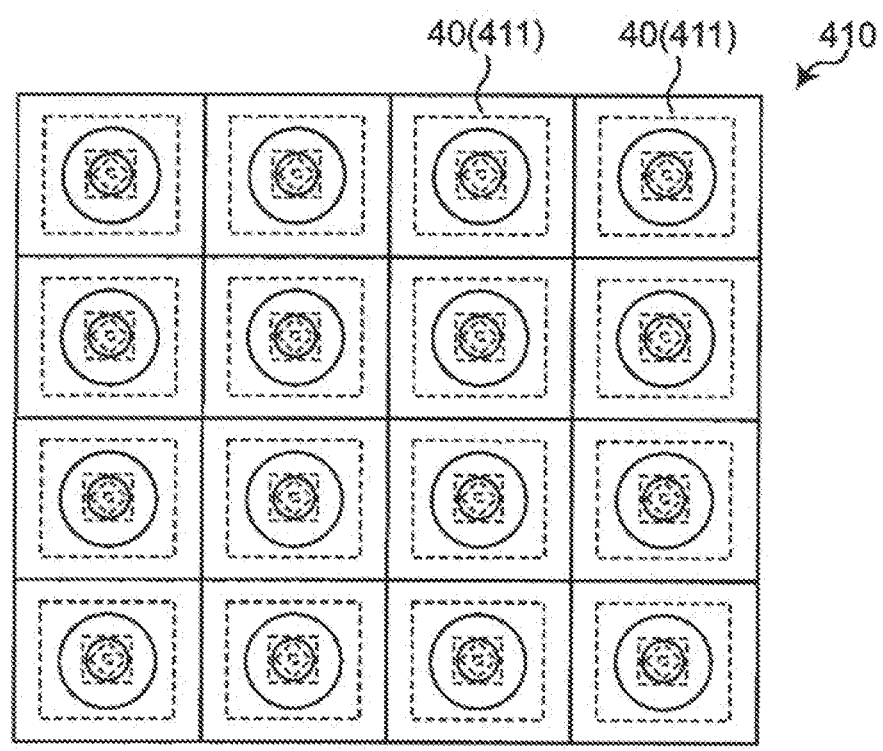
FIG. 8A is a schematic top view of a light-emitting device according to a first modification.

FIG. 8A shows a light-emitting device 410 according to a first modification of the present invention. The light-emitting device 410 includes a plurality of light-emitting devices 40.

The light-emitting device 410 in FIG. 8A is constituted of an array of a plurality of light-emitting devices 40 each shown in FIG. 2A, FIG. 2B, and FIG. 2C. In the first modification, each light-emitting device 40 is also referred to as a "region 411" of the light-emitting device 410. That is, a single "region 411" includes a single light-emitting element 60 and a single light-emitting part 50. Each "region 411" can be deemed to be a single "cell", and the light-emitting device 410 in FIG. 8A can be deemed to be a single "segment" including 16 cells (four rows×four columns).

(Second Modification)

Figure 8B:
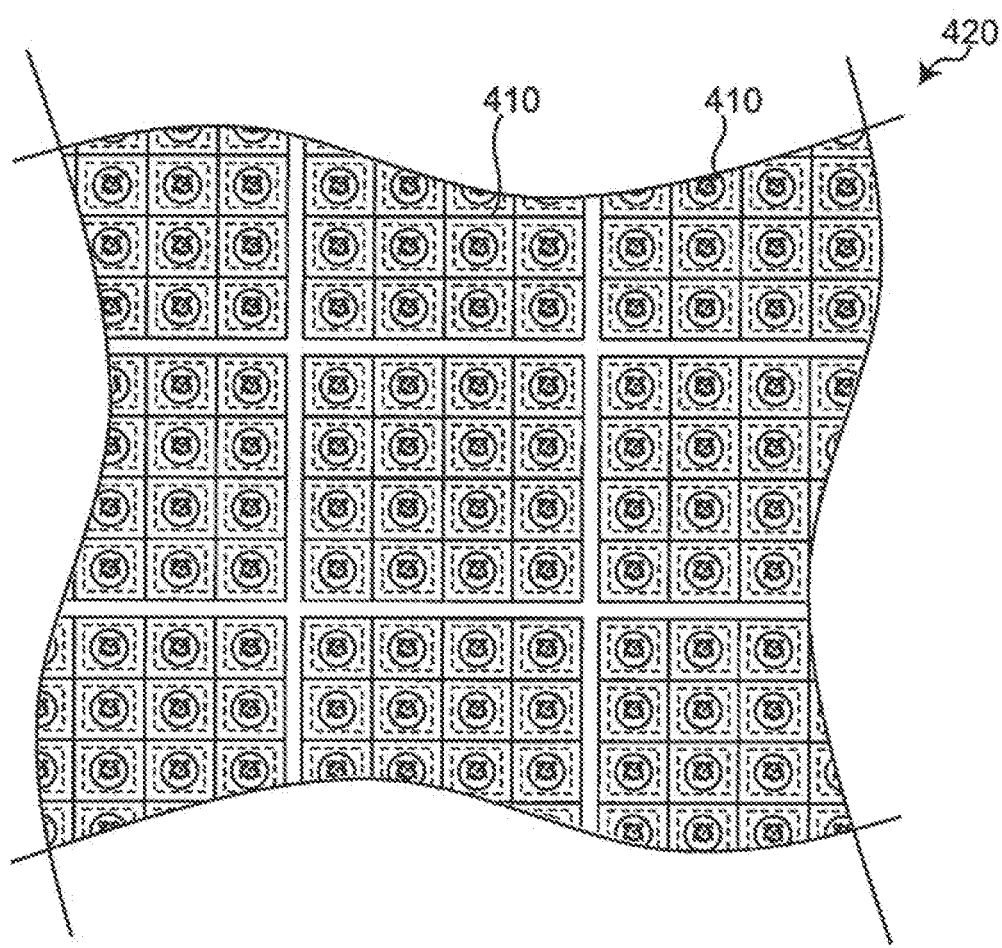
FIG. 8B is a schematic top view of a light-emitting device according to a second modification.

FIG. 8B shows a light-emitting device 420 according to a second modification of the present invention. The light-emitting device 420 includes a plurality of light-emitting devices 410 of the first modification.

The light-emitting device 420 in FIG. 8B is constituted of an array of a plurality of light-emitting devices 410 each shown in FIG. 8A. As described referring to the first modification, the light-emitting device 410 can be deemed to be a single segment including 16 cells, and the light-emitting device 420 can be deemed to be a single module including a plurality of segments (for example, 128 segments=2048 cells).

The light-emitting device 410 according to the first modification and the light-emitting device 420 according to the second modification each include a plurality of light-emitting elements 60. In the case in which the light-emitting devices 410 and 420 are driven, the current supplied to each light-emitting element 60 can be controlled by the driving method according to an embodiment of the present invention.

In the case in which the light-emitting module according to an embodiment includes the light-emitting device 410 or 420, a single controller 70 may be included for each cell of the light-emitting device 410 or 420, or a single controller 70 may be included for a plurality of cells (for example, one for each segment).

(Third Modification)

Figure 9:
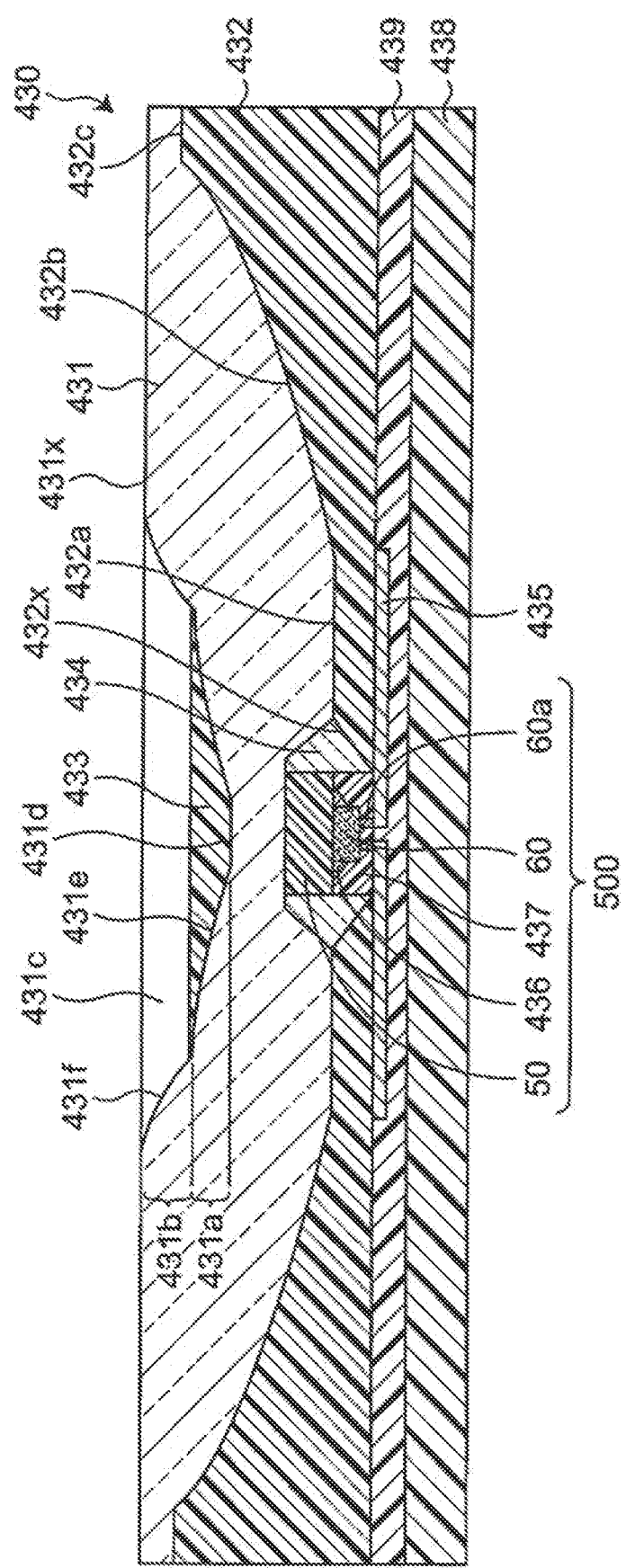
FIG. 9 is a schematic cross-sectional view of a light-emitting device according to a third modification.

FIG. 9 shows a light-emitting device 430 according to a third modification of the present invention. The light-emitting device 430 is a modification of the light-emitting device 40 shown in FIG. 2A to FIG. 2C.

The shapes of a light-guiding plate 431, a white resin 432, a transparent resin 434, and a wiring layer 435 of the light-emitting device 430 differ from the respective shapes of the light-guiding plate 41, the white resin 42, the transparent resin 44, and the wiring layer 45 of the light-emitting device 40.

The light-emitting device 430 does not include the light-diffusing unit 43 covering the upper surface of the light-emitting part 50 in the light-emitting device 40 shown in FIG. 2A and FIG. 2C. Instead, the light-emitting device 430 includes a light-reflective layer 433 in a recess 431c. For the light-reflective layer 433, light-transmissive resin or the like containing a diffusing material can be used. The light-emitting device 430 may further include a light-diffusing unit covering the upper surface of the light-emitting part 50.

Unlike the light-emitting device 40, the light-emitting device 430 includes a light-transmissive adhesive member 436 and a light-reflective member 437.

The material constituting each member of the light-emitting device 430 according to the third modification and properties of each member are substantially the same as those of the corresponding member in the light-emitting device 40 according to an embodiment.

The light-emitting device 430 according to the third modification will be described below, focusing mainly on the differences from the light-emitting device 40.

The light-emitting device 430 according to the third modification includes the light-emitting element 60, the light-reflective member 437 covering the lateral surfaces of the light-emitting element 60, and the light-emitting part 50 covering the upper surface of the light-emitting element 60 and the upper surface of the light-reflective member 437. In the third modification, the light-emitting element 60, the light-reflective member 437, and the light-emitting part 50 may be collectively referred to as a "light source 500".

The light-emitting device 430 may further include the light-transmissive adhesive member 436 as a portion of the light source 500. The light-transmissive adhesive member 436 is disposed between the light-emitting element 60 and the light-reflective member 437 and covers portions of the lateral surfaces of the light-emitting element 60 and a portion of the lower surface of the light-emitting part 50. With the light-transmissive adhesive member 436, light emitted from the lateral surfaces of the light-emitting element 60 (to be more precise, the semiconductor layered body of the light-emitting element 60) enters the light-transmissive adhesive member 436, and the light is then reflected at the boundary between the light-transmissive adhesive member 436 and the light-reflective member 437 and enters the light-emitting part 50.

The light-emitting element 60 includes a pair of element electrodes 60a on the lower surface side. Each of the element electrodes 60a is connected to a wiring layer 435. The wiring layer 435 extends between the white resin 432 and an insulating member 439.

The light-emitting device 430 further includes the transparent resin 434 covering the lateral surfaces of the light-reflective member 437 and the lateral surfaces of the light-emitting part 50. The lower surface of the light-guiding plate 431 has a recess of a trapezoidal cross-sectional shape, and the light source 500 is fixed inside the recess using the transparent resin 434. The white resin 432 covers the lower surface of the light-guiding plate 431 and portions of the lateral surfaces of the transparent resin 434. The upper surface (light extraction surface 431x) of the light-guiding plate 431 has the recess 431c. The recess 431c is located directly above the light source 500, and a base surface 431d of the recess 431c faces the upper surface (upper surface of the light-emitting part 50) of the light source 500. The recess 431c has the shape of a combination of two recesses having different sizes. The lower portion (portion close to the light source 500) is a first portion 431a with the shape of a downward conical frustum (truncated cone), and the upper portion (light extraction surface 431x of the light-guiding plate 431) is a second portion 431b with the shape of a downward conical frustum (truncated cone). The maximum opening dimension of the second portion 431b is larger than the maximum opening dimension of the first portion 431a. The dimension (corresponding to the maximum opening dimension of the first portion 431a) of the upper opening of the first portion 431a is equal to the dimension (corresponding to the minimum opening dimension of the second portion 431b) of the lower opening of the second portion 431b. The first portion 431a and the second portion 431b are configured such that the lower opening of the second portion 431b is in contact with the upper opening of the first portion 431a, which constitute the single recess 431.

As shown in FIG. 9, each of the first portion 431a and the second portion 431b has the shape of a conical frustum with a deformed lateral surface (curving toward the inside of the recess 431c). In the cross-sectional view of FIG. 9, a lateral surface 431e of the first portion 431a and a lateral surface 431f of the second portion 431b are both indicated by curved lines convex toward the inside of the recess 431c (also deemed to be convex upward in FIG. 9).

The light-emitting device 430 further includes the light-reflective layer 433 disposed inside the recess 431c. With the light-reflective layer 433 disposed inside the recess 431c, light of high intensity emitted directly upward from the light source 500 is reflected at the light-reflective layer 433. The reflected light propagates through the light-guiding plate 431 while being reflected at the light-reflective layer 433 and the white resin 432 and is extracted from the light extraction surface 431x. That is, light traveling directly upward from the light source 500 can be spread in the direction of radiation along the outline of the recess 431c. With this structure, light emitted from the light-emitting device 430 can be made uniform.

The light-reflective layer 433 can be disposed to fill a portion or the whole of the recess 431c. In particular, the light-reflective layer 433 is preferably formed only in the first portion 431a of the recess 431c closer to the light source 500. A large emission area of the light-guiding plate 431 can be secured while light having high light intensity emitted directly upward from the light source 500 is shielded, which contributes to further uniformization of light emitted from the light-emitting device 430.

The transparent resin 434 surrounds the lateral surfaces of the light source 500 and has the function of fixing the light source 500 to the recess with a trapezoidal cross-sectional shape at the lower surface side of the light-guiding plate 431. The lateral surfaces of the transparent resin 434 shown in FIG. 9 include an upper inclined surface in contact with the light-guiding plate 431 and a lower inclined surface in contact with the white resin 432. The upper inclined surface and the lower inclined surface differ from each other in the directions of inclination, and lines in contact with these inclined surfaces are ridge lines protruding outward.

The white resin 432 has the upper surface in contact with the light-guiding plate 431, and the lower surface in contact with the wiring layer 435 and the insulating member 439. Further, the white resin 432 has a through hole 432x that holds the light source 500, and the inner surface (tapered surface broadening upward) of the through hole 432x is in contact with the lower inclined surface of the transparent resin 434.

The upper surface of the white resin 432 includes a flat surface 432a around the through hole 432x and a curved inclined surface 432b around the flat surface 432a. The curved inclined surface 432b is gently curved to form the shape of a bowl and can reflect upward (toward the light extraction surface 431x of the light-guiding plate 431) the light emitted from the light source 500 and the light reflected downward from the light-reflective layer 433. A flat top portion 432c may be provided outward of the curved inclined surface 432b.

The light-emitting device 430 further includes the insulating member 439 and a substrate 438 on the lower surface side of the white resin 432.

The insulating member 439 covers the lower surface of the white resin 432 and the wiring layer 435. A portion of the wiring layer 435 is exposed from the insulating member 439, so that the wiring layer 435 can be electrically connected to an external device.

The substrate 438 is disposed on the lower surface side of the insulating member 439. The substrate 438 may be a wiring board, and there may be electrical continuity with the wiring layer 435 partially exposed from the insulating member 439. The substrate 438 may include electrodes to be connected to external electrodes.

The light-emitting device 40 shown in FIG. 2A and FIG. 2C may also include the insulating member 439 and the substrate 438.

The light-emitting module as shown in FIG. 1 may be constituted using the light-emitting device 430 of the third modification. An array of a plurality of light-emitting devices 430 may constitute the light-emitting device (segment) as shown in FIG. 8A or the light-emitting device (module) as shown in FIG. 8B.

Reference Signs List

40, 410, 420, and 430: light-emitting device; 41 and 431: light-guiding plate; 41c and 431c: recess; 42 and 432: white resin; 43: light-diffusing unit; 433: light-reflective layer; 44 and 434: transparent resin; 45 and 435: wiring layer; 436: light-transmissive adhesive member; 50: light-emitting part; 52: phosphor; 60: light-emitting element; 70: controller; 90: power source; 100: light-emitting module; and 500: light source.

What is claimed is:

1. A method of driving a light-emitting device, the method comprising:
   driving the light-emitting device to emit light with a desired emission luminance, the light-emitting device having a light-emitting element and a light-emitting part that contains two or more types of phosphors adapted to be excited by light emitted from the light-emitting element, the two or more types of phosphors having respectively different afterglow characteristics,
   wherein the driving of the light-emitting device includes supplying a current to the light-emitting element during a conducting period including
      a maximum current supply period in which a maximum current in the conducting period is supplied to the light-emitting element, and
      subsequent to the maximum current supply period, a current reduction period in which the current supplied to the light-emitting element is reduced continuously or stepwise from the maximum current,
   wherein the current reduction period includes a current retention period in which the current supplied to the light-emitting element is retained at a constant value smaller than the maximum current over a predetermined period of time from a beginning of the current reduction period,
   the constant value is larger than a standard current required for allowing the light-emitting device to emit light with the desired emission luminance, and
   the constant value and a duration of the current retention period are controlled based on a time-integrated luminance of the light-emitting device over the conducting period.

2. The method according to claim 1, wherein
   a current value supplied to the light-emitting element is controlled such that a luminance of the light-emitting device at an end of the current reduction period is 50% or less of a maximum luminance of the light-emitting device.

3. The method according to claim 1, wherein
   a current value supplied to the light-emitting element is controlled such that an idle period in which no current is supplied to the light-emitting element is further included after the conducting period and such that a period of time from a beginning of the idle period to a point in time when a luminance of the light-emitting device reaches zero is 20% or less of a total of the conducting period and the idle period.

4. The method according to claim 1, wherein
   a value of the maximum current is controlled based on a time-integrated luminance of the light-emitting device over the conducting period.

5. The method according to claim 1, wherein
   at least one of the two or more types of phosphors is a $Mn^{4+}$-activated fluoride phosphor.

6. A light-emitting module comprising:
   a light-emitting device having a light-emitting element and a light-emitting part that contains two or more types of phosphors adapted to be excited by light emitted from the light-emitting element, the two or more types of phosphors having respectively different afterglow characteristics; and
   a controller configured to control a current supplied from a power source to the light-emitting element so as to emit light with a desired emission luminance so that the current is supplied to the light-emitting element during a conducting period including
      a maximum current supply period in which a maximum current in the conducting period is supplied to the light-emitting element, and
      subsequent to the maximum current supply period, a current reduction period in which the current supplied to the light-emitting element is reduced continuously or stepwise from the maximum current,
   the controller is configured to control the current supplied to the light-emitting element such that the current reduction period includes a current retention period in which the current supplied to the light-emitting element is retained at a constant value smaller than the maximum current over a predetermined period of time from a beginning of the current reduction period,
   the constant value is larger than a standard current required for allowing the light-emitting device to emit light with the desired emission luminance, and
   the constant value and a duration of the current retention period are controlled based on a time-integrated luminance of the light-emitting device over the conducting period.

7. The light-emitting module according to claim 6, wherein
   the controller is configured to control the current supplied to the light-emitting element such that a luminance of the light-emitting device at an end of the current reduction period is 50% or less of a maximum luminance of the light-emitting device.

8. The light-emitting module according to claim 6, wherein
   the controller is configured to control the current supplied to the light-emitting element such that
      the conducting period further includes an idle period in which no current is supplied to the light-emitting element after the current reduction period, and
      a period of time from a beginning of the idle period to a point in time when a luminance of the light-emitting device reaches zero is 20% or less of the conducting period.

9. The light-emitting module according to claim 6, wherein a value of the maximum current is set based on a time-integrated luminance of the light-emitting device over the conducting period.

10. The light-emitting module according to claim 6, wherein at least one of the two or more types of phosphors is a $Mn^{4+}$-activated fluoride phosphor.

* * * * *